(12) United States Patent (10) Patent No.: US 12,638,489 B2

Shimomura et al. (45) Date of Patent: May 26, 2026

(54) COMMUNICATION DEVICE, COMMUNICATION SYSTEM, AND COMMUNICATION METHOD

(71) Applicant: Hitachi Astemo, Ltd., Hitachinaka (JP)

(72) Inventors: Soshi Shimomura, Tokyo (JP); Yasuhiro Ikeda, Tokyo (JP); Yutaka Uematsu, Tokyo (JP); Hideyuki Sakamoto, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 741 days.

(21) Appl. No.: 18/015,441

(22) PCT Filed: Jul. 12, 2021

(86) PCT No.: PCT/JP2021/026188

§ 371 (c)(1),
(2) Date: Jan. 10, 2023

(87) PCT Pub. No.: WO2022/030192

PCT Pub. Date: Feb. 10, 2022

(65) Prior Publication Data

US 2023/0273251 A1 Aug. 31, 2023

(30) Foreign Application Priority Data

Aug. 4, 2020 (JP) ................................. 2020-132510

(51) Int. Cl.
*G01R 31/11* (2006.01)
*H04B 3/46* (2015.01)
(52) U.S. Cl.
CPC ............... *G01R 31/11* (2013.01); *H04B 3/46* (2013.01)
(58) Field of Classification Search
CPC ........... G01R 31/11; H04B 3/46; H04L 25/02; H04L 25/03
See application file for complete search history.

(56) References Cited

U.S. PATENT DOCUMENTS

| | | | |
|---|---|---|---|
| 2002/0169585 A1* | 11/2002 | Jones ..................... | H04B 3/493 |
| | | | 702/189 |
| 2006/0007992 A1* | 1/2006 | Wang ...................... | H04B 3/46 |
| | | | 375/224 |

(Continued)

FOREIGN PATENT DOCUMENTS

| | | |
|---|---|---|
| JP | 54-51859 A | 4/1979 |
| JP | 3-46420 A | 2/1991 |

(Continued)

OTHER PUBLICATIONS

International Search Report (PCT/ISA/210) issued in PCT Application No. PCT/JP2021/026188 dated Sep. 28, 2021 with English translation (four (4) pages).

(Continued)

*Primary Examiner* — Michael J Dalbo
(74) *Attorney, Agent, or Firm* — Crowell & Moring LLP

(57) ABSTRACT

A communication device includes: a transmitting circuit that repeatedly outputs a first prescribed signal to a transmission path at a prescribed cycle; a receiving circuit that receives a second prescribed signal repeatedly output at the prescribed cycle from another communication device via the transmission path; a waveform equivalence processing unit that performs waveform equivalence processing on the signal received by the receiving circuit; a holding unit that holds parameters of the waveform equivalence processing; a storage unit that stores information on a signal propagation speed in the transmission path, duration of a prescribed cycle, and a transmission rate; and an abnormality position determining unit that calculates a distance to a position of an abnormality in the transmission path using information on the parameter caused by the abnormality of the transmission path among the parameters and the information stored in the storage unit.

9 Claims, 13 Drawing Sheets

(56)                    References Cited

U.S. PATENT DOCUMENTS

2015/0077131 A1*   3/2015   Incarbone ............. G01R 31/58
                                                              324/533
2016/0087832 A1*   3/2016   Wilson ..................... H04L 1/24
                                                              370/242
2018/0302122 A1*   10/2018  Chen ........................ H04B 3/23

FOREIGN PATENT DOCUMENTS

JP          2017-129378  A      7/2017
WO     WO 2017/126229 A1       7/2017

OTHER PUBLICATIONS

Japanese-language Written Opinion (PCT/ISA/237) issued in PCT Application No. PCT/JP2021/026188 dated Sep. 28, 2021 (three (3) pages).

* cited by examiner

Figure 1:
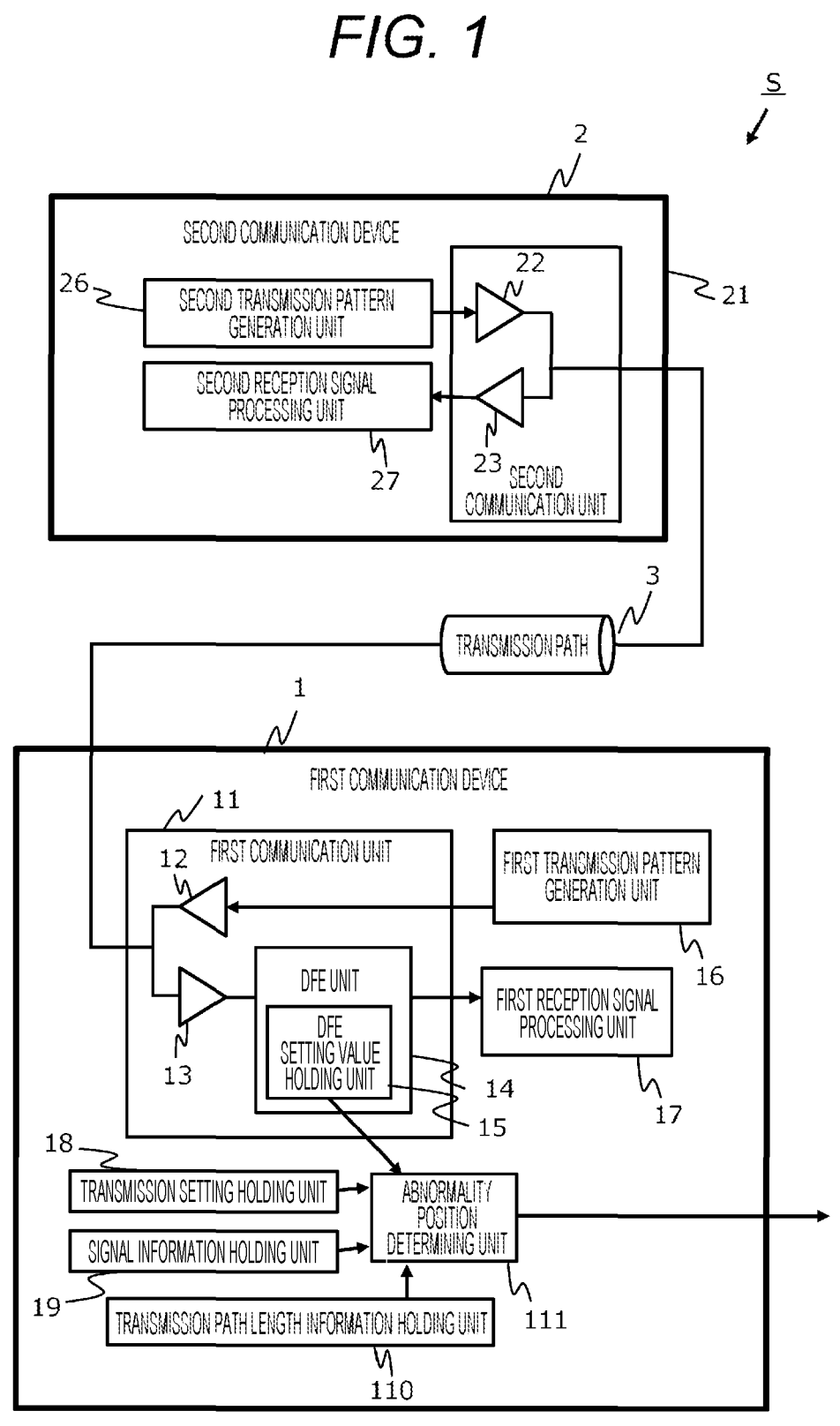

SECOND COMMUNICATION DEVICE

26 — SECOND TRANSMISSION PATTERN GENERATION UNIT

22

21

SECOND RECEPTION SIGNAL PROCESSING UNIT

27

23 SECOND COMMUNICATION UNIT

3

TRANSMISSION PATH

1

FIRST COMMUNICATION DEVICE

11

12 FIRST COMMUNICATION UNIT

FIRST TRANSMISSION PATTERN GENERATION UNIT

16

DFE UNIT

DFE SETTING VALUE HOLDING UNIT

FIRST RECEPTION SIGNAL PROCESSING UNIT

13

14

15

17

18 — TRANSMISSION SETTING HOLDING UNIT

SIGNAL INFORMATION HOLDING UNIT

19

TRANSMISSION PATH LENGTH INFORMATION HOLDING UNIT

ABNORMALITY POSITION DETERMINING UNIT

| TAP NUMBER | TAP COEFFICIENT |
|---|---|
| 1 | 0.4 |
| 2 | 0.0001 |
| 3 | 0 |
| 4 | 0 |
| 5 | 0.0002 |
| 6 | 0.15 |
| 7 | 0 |
| ⋮ | ⋮ |
| N | 0 |

FIG. 4

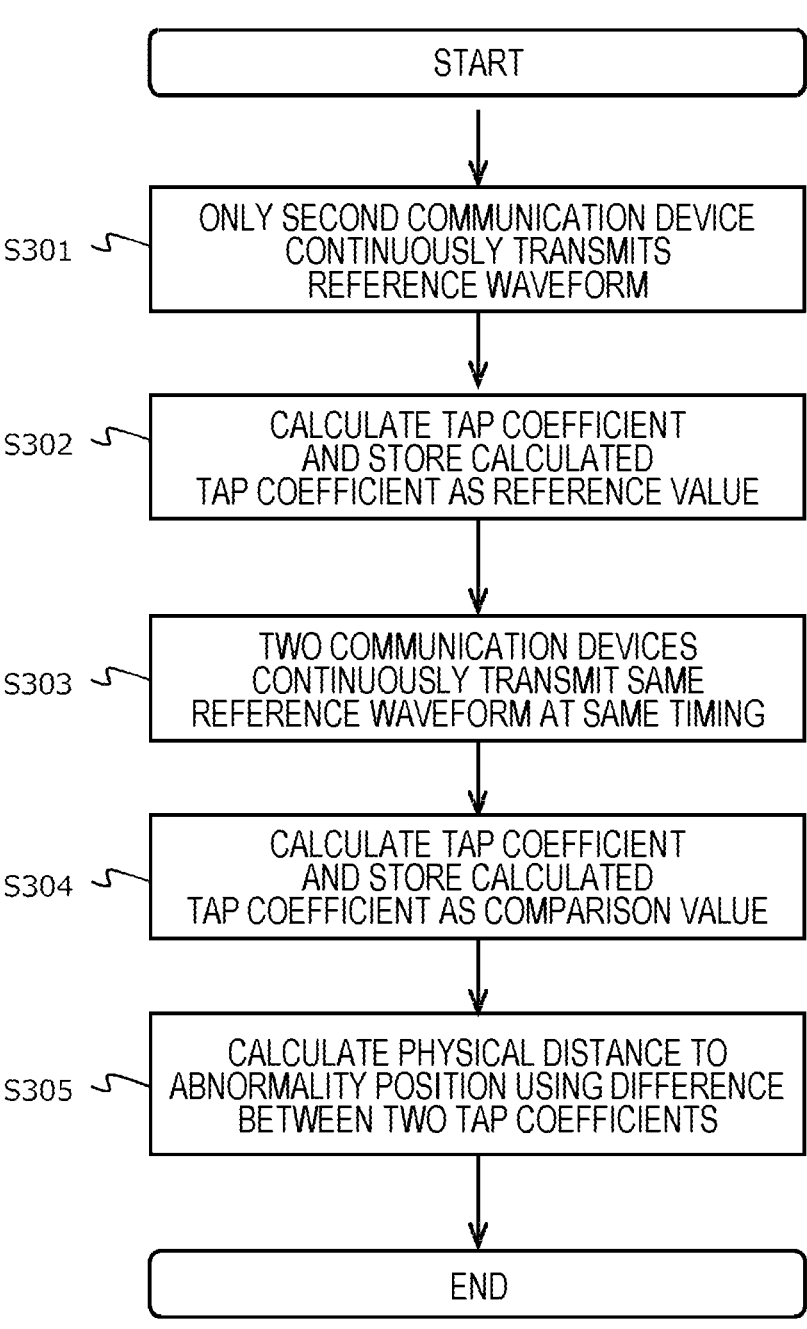

START

S301 — ONLY SECOND COMMUNICATION DEVICE CONTINUOUSLY TRANSMITS REFERENCE WAVEFORM

S302 — CALCULATE TAP COEFFICIENT AND STORE CALCULATED TAP COEFFICIENT AS REFERENCE VALUE

S303 — TWO COMMUNICATION DEVICES CONTINUOUSLY TRANSMIT SAME REFERENCE WAVEFORM AT SAME TIMING

S304 — CALCULATE TAP COEFFICIENT AND STORE CALCULATED TAP COEFFICIENT AS COMPARISON VALUE

S305 — CALCULATE PHYSICAL DISTANCE TO ABNORMALITY POSITION USING DIFFERENCE BETWEEN TWO TAP COEFFICIENTS

END

Figure 11:
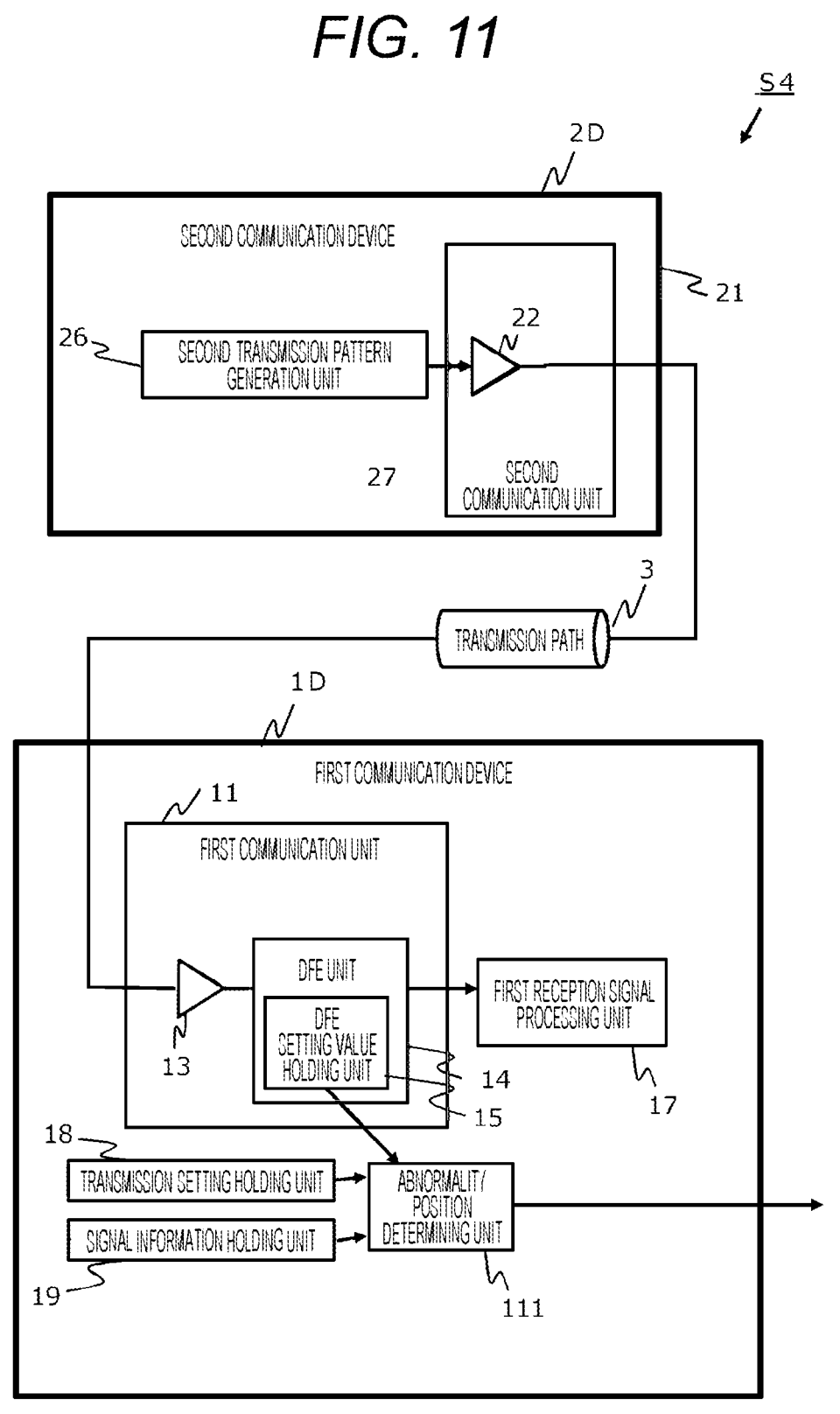

SECOND COMMUNICATION DEVICE

21

26

SECOND TRANSMISSION PATTERN
GENERATION UNIT

22

27

SECOND
COMMUNICATION UNIT

3

TRANSMISSION PATH

1D

FIRST COMMUNICATION DEVICE

11

FIRST COMMUNICATION UNIT

DFE UNIT

DFE
SETTING VALUE
HOLDING UNIT

13

14

15

FIRST RECEPTION SIGNAL
PROCESSING UNIT

17

18

TRANSMISSION SETTING HOLDING UNIT

SIGNAL INFORMATION HOLDING UNIT

19

ABNORMALITY/
POSITION
DETERMINING UNIT

Figure 13:
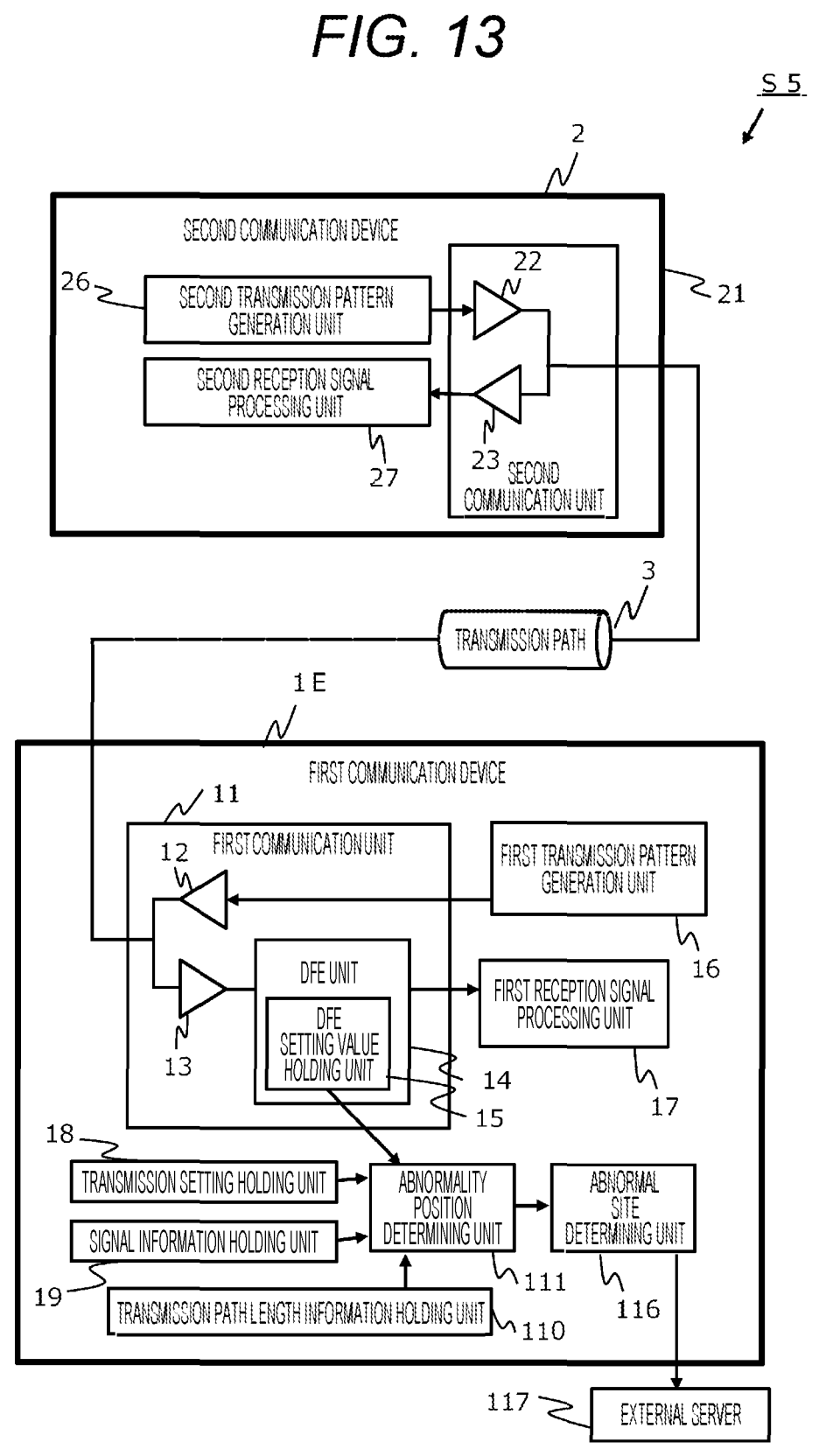

SECOND COMMUNICATION DEVICE 2

26 — SECOND TRANSMISSION PATTERN GENERATION UNIT

22

21

SECOND RECEPTION SIGNAL PROCESSING UNIT

23 SECOND COMMUNICATION UNIT

27

TRANSMISSION PATH 3

1 E

FIRST COMMUNICATION DEVICE

11

12 FIRST COMMUNICATION UNIT

FIRST TRANSMISSION PATTERN GENERATION UNIT

16

DFE UNIT

13

DFE SETTING VALUE HOLDING UNIT

FIRST RECEPTION SIGNAL PROCESSING UNIT

14

15

17

18 — TRANSMISSION SETTING HOLDING UNIT

SIGNAL INFORMATION HOLDING UNIT

19

TRANSMISSION PATH LENGTH INFORMATION HOLDING UNIT

ABNORMALITY POSITION DETERMINING UNIT

ABNORMAL SITE DETERMINING UNIT

111

116

110

117 — EXTERNAL SERVER

COMMUNICATION DEVICE, COMMUNICATION SYSTEM, AND COMMUNICATION METHOD

TECHNICAL FIELD

The present invention relates to a communication device, a communication system, and a communication method.

BACKGROUND ART

With recent development of communication technologies, a frequency of a signal propagating through a transmission path tends to increase. For example, in the field of in-vehicle communication, a plurality of high-resolution cameras have been installed with development of automatic driving, and a transmission rate of a signal has increased. In such high-speed communication, a defect in the transmission path, such as a cable or a connector, greatly affects signal quality. In the in-vehicle use or the like requiring securement of the signal quality under various environmental conditions, it is important to diagnose an abnormality in the transmission path. PTL 1 discloses a transmission path deterioration detection device including: a transmission path of a transmission system; a plurality of communication devices connected to the transmission path; a signal generation unit that is provided in one communication device among the plurality of communication devices and generates a pseudo communication signal; and a deterioration detection unit that is provided in one communication device among the plurality of communication devices and detects deterioration of the transmission path based on reception of the pseudo communication signal passing through the transmission path.

CITATION LIST

Patent Literature

PTL 1: JP 2017-129378 A

SUMMARY OF INVENTION

Technical Problem

In the invention described in PTL 1, it is impossible to determine an abnormality position of the transmission path.

Solution to Problem

A communication device according to a first aspect of the present invention includes: a transmitting circuit that repeatedly outputs a first prescribed signal to a transmission path at a prescribed cycle; a receiving circuit that receives a second prescribed signal repeatedly output at the prescribed cycle from another communication device via the transmission path; a waveform equivalence processing unit that performs waveform equivalence processing on the signal received by the receiving circuit; a holding unit that holds parameters of the waveform equivalence processing; a storage unit that stores information on a signal propagation speed in the transmission path, a duration of a prescribed cycle, and a transmission rate; and an abnormality position determining unit that calculates a distance to a position of an abnormality in the transmission path using information on the parameter caused by the abnormality of the transmission path among the parameters and the information stored in the storage unit.

A communication system according to a second aspect of the present invention is a communication system including a first communication device and a second communication device connected via a transmission path. The second communication device includes a second transmitting circuit that repeatedly outputs a second prescribed signal to the first communication device via the transmission path at a prescribed cycle. The first communication device includes: a first transmitting circuit that repeatedly outputs a first prescribed signal to the transmission path at the prescribed cycle; a receiving circuit that receives the signal from the transmission path; a waveform equivalence processing unit that performs waveform equivalence processing on the signal received by the receiving circuit; a holding unit that holds parameters of the waveform equivalence processing; a storage unit that stores information on a signal propagation speed in the transmission path, a duration of a prescribed cycle, and a transmission rate; and an abnormality position determining unit that calculates a distance to a position of an abnormality in the transmission path using information on the parameter caused by the abnormality of the transmission path among the parameters and the information stored in the storage unit.

A communication method according to a third aspect of the present invention is a communication method executed by a communication device, which includes a receiving circuit that receives a second prescribed signal repeatedly output from another communication device at a prescribed cycle via a transmission path, and a storage unit that stores information on a signal propagation speed in the transmission path, a duration of a prescribed cycle, and a transmission rate, and includes: repeatedly outputting a first prescribed signal to the transmission path at the prescribed cycle; performing waveform equivalence processing on the signal received by the receiving circuit; and calculating a distance to a position of an abnormality in the transmission path using information on a parameter caused by the abnormality of the transmission path among parameters in the waveform equalization processing and the information stored in the storage unit.

Advantageous Effects of Invention

According to the present invention, it is possible to determine the abnormality position of the transmission path.

BRIEF DESCRIPTION OF DRAWINGS

FIG. 1 is a functional configuration diagram of a communication system according to a first embodiment.
FIG. 3 is a view illustrating the tap coefficient in FIG. 2.
FIG. 4 is a flowchart illustrating abnormality position determination processing.

FIG. 11 is a functional configuration diagram of a communication system according to a fifth embodiment.

FIG. 12 is a schematic diagram illustrating signal propagation according to the fifth embodiment.

FIG. 13 is a functional configuration diagram of a communication system according to a sixth embodiment.

DESCRIPTION OF EMBODIMENTS

Figure 2:
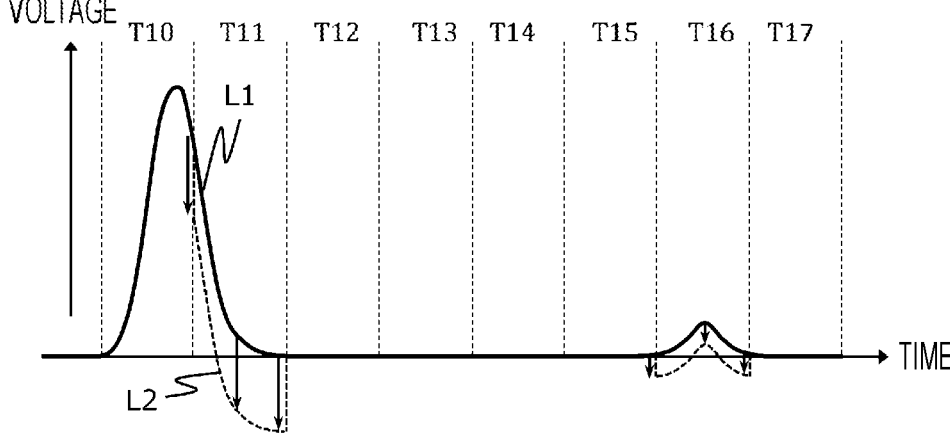
FIG. 2 is a view for describing a tap coefficient.

Hereinafter, embodiments of the present invention will be described with reference to the drawings. The following description and drawings are examples given to describe the present invention, and are appropriately omitted and simplified for clarification of the description. The present invention can be implemented in various other forms. Each constituent element may be singular or plural unless specifically limited. Positions, sizes, shapes, ranges, and the like of the respective constituent elements illustrated in the drawings do not always indicate actual positions, sizes, shapes, ranges and the like in order to facilitate understanding of the invention. Therefore, the present invention is not necessarily limited to the positions, sizes, shapes, ranges, and the like disclosed in the drawings. In addition, the present invention is also applicable to the general field of information devices.

First Embodiment

Hereinafter, a first embodiment of a communication system will be described with reference to FIGS. 1 to 7. FIG. 1 is a functional configuration diagram of a communication system S. The communication system S includes a first communication device 1 and a second communication device 2. The first communication device 1 and the second communication device 2 are electrically connected via a transmission path 3. In the present embodiment, bidirectional communication is performed, and the first communication device 1 and the second communication device 2 mutually transmit signals via the transmission path 3.

The second communication device 2 includes a second communication unit 21 configured to transmit and receive a signal, a second transmission pattern generation unit 26, and a second reception signal processing unit 27. The second communication unit 21 includes a second transmitting circuit 22 and a second receiving circuit 23. The second transmission pattern generation unit 26 is connected to the second transmitting circuit 22, and transmits a signal generated by the second transmission pattern generation unit 26 via the second transmitting circuit 22. The second receiving circuit 23 is connected to the second reception signal processing unit 27, and the second reception signal processing unit 27 converts a received analog signal into a symbol value, in other words, a digital signal.

The second transmitting circuit 22, the second receiving circuit 23, the second transmission pattern generation unit 26, and the second reception signal processing unit 27 are, for example, hardware circuits. However, a part of the second transmission pattern generation unit 26 and the second reception signal processing unit 27 may be implemented by software or a rewritable logic circuit. In the case of being implemented by software, a processor (not illustrated) reads a program from a ROM which is a read-only storage area (not illustrated) and develops and executes the program in a storage area (not illustrated).

The first communication device 1 includes a first communication unit 11, a first transmission pattern generation unit 16, a first reception signal processing unit 17, a transmission setting holding unit 18, a signal information holding unit 19, a transmission path length information holding unit 110, and an abnormality position determining unit 111. Hereinafter, the transmission setting holding unit 18, the signal information holding unit 19, and the transmission path length information holding unit 110 will be sometimes collectively referred to as a "storage unit". The first communication unit 11 includes a first transmitting circuit 12, a first receiving circuit 13, and a DFE unit 14. The DFE unit 14 is connected to the first receiving circuit 13 and has a function of performing waveform equivalence processing, that is, equalizing on a signal received by the first receiving circuit 13. Therefore, the DFE unit 14 can be referred to as a "waveform equivalence processing unit".

More specifically, the DFE unit 14 is a decision feedback equalizer. The DFE unit 14 calculates a setting value using a known method and stores the setting value in the DFE setting value holding unit 15. The DFE unit 14 in the present embodiment has N taps and does not have a floating tap. Hereinafter, the setting value of the DFE unit 14 will be also referred to as a "tap coefficient" or a "parameter". Each of the taps corrects a signal at a time delayed from a reference time by one unit interval (UI), and one UI in the present embodiment is a reciprocal of a transmission rate, for example, one nanosecond. Note that the DFE setting value holding unit 15 will be also referred to as a "holding unit" hereinafter.

The first transmission pattern generation unit 16 is connected to the first transmitting circuit 12. A signal generated by the first transmission pattern generation unit 16 is transmitted to the transmission path 3 via the first transmitting circuit 12. The first reception signal processing unit 17 is connected to the DFE unit 14 and converts an analog signal received by the first receiving circuit 13 into a symbol value.

The transmission setting holding unit 18 stores communication setting information such as a transmission rate. The signal information holding unit 19 stores signal information such as a signal propagation speed in the transmission path 3. The transmission path length information holding unit 110 stores information on a length of the transmission path 3.

The abnormality position determining unit 111 determines a position where an abnormality has occurred in the transmission path 3, specifically, an abnormality position where a signal is reflected. For this determination, the abnormality position determining unit 111 uses the setting value of the DFE unit 14 acquired from the DFE setting value holding unit 15, the communication setting information, such as the transmission rate, acquired from the transmission setting holding unit 18, the signal information such as the signal propagation speed in the transmission path 3 acquired from the signal information holding unit 19, and the information on the length of the transmission path 3 acquired from the transmission path length information holding unit 110. The abnormality position determining unit 111 outputs information on the determined abnormality position to a configuration (not illustrated) inside the first communication device 1 or to the outside of the first communication device 1.

The first transmitting circuit 12, the first receiving circuit 13, the first transmission pattern generation unit 16, and the first reception signal processing unit 17 are, for example, hardware circuits. However, a part of the first transmission pattern generation unit 16 and the first reception signal processing unit 17 may be implemented by software or a rewritable logic circuit. In the case of being implemented by software, a processor (not illustrated) reads a program from a ROM (not illustrated) and develops and executes the program in a storage area (not illustrated). The abnormality position determining unit 111 is implemented by software. The transmission setting holding unit 18, the signal information holding unit 19, and the transmission path length information holding unit 110 are implemented by a non-volatile storage device.

(Tap Coefficient)

FIG. 2 is a view illustrating setting values of the DFE unit 14, that is, tap coefficients. In FIG. 2, the horizontal axis represents time, and the vertical axis represents a voltage received by the first receiving circuit 13. Each of T10 to T17 illustrated in FIG. 2 is a period having the same time length. In a waveform example L1 received by the first receiving circuit 13, a waveform is generally distorted due to the influence from a transmission path loss or a transmission path abnormality in the transmission path 3. The DFE is a function of adjusting a threshold of a symbol so as to compensate for such a waveform distortion, and each of the taps performs compensation corresponding to a prescribed time frame. In the waveform L1, the influence of a signal received in the period T10 appears in the period T11 and the period T16.

In the period T11, a waveform distortion due to a loss of a radio frequency component, in other words, intersymbol interference (ISI) noise appears in the waveform L1. In the period T16, a waveform distortion due to reflection caused by the abnormality of the transmission path, in other words, reflection noise appears in the waveform L1. In the period T11 and the period T16, the DFE unit 14 increases a threshold for determining a symbol of "01" to relatively compensate for the received waveform L1 to obtain a waveform L2. Pieces of information on the amount of compensation thereof are stored as the tap coefficients in the DFE setting value holding unit 15.

FIG. 3 is a view illustrating the tap coefficients in FIG. 2. It can be seen from the tap coefficient information of the DFE that the first and sixth tap coefficients are higher than the other tap coefficients and the waveform after one symbol and the waveform after six symbols are compensated.

(Determination of Abnormality Position)

Figure 5A:
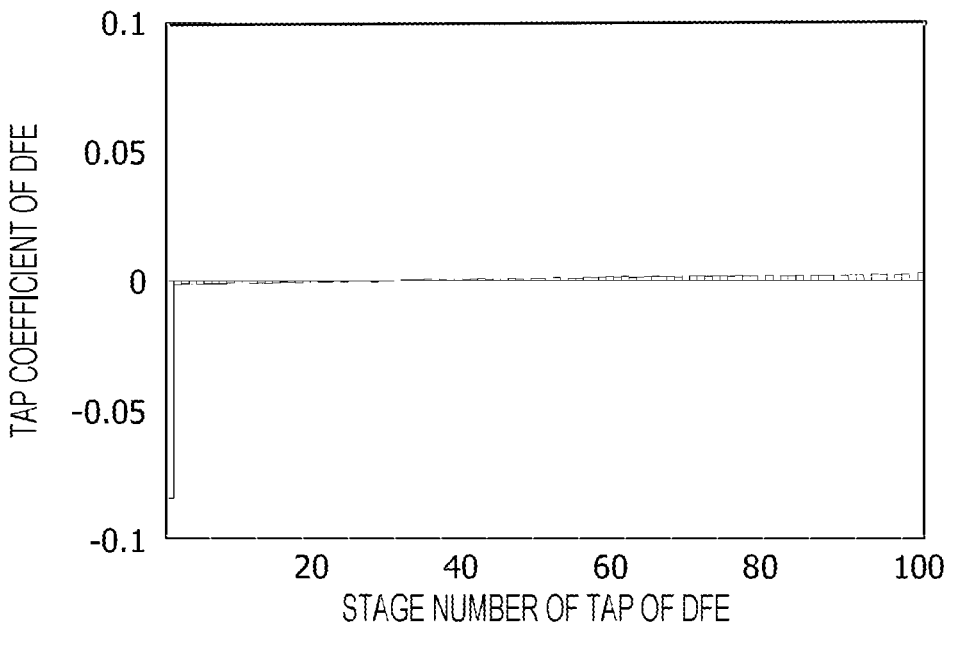
FIG. 5 is a view illustrating an example of the tap coefficient.
Figure 5B:
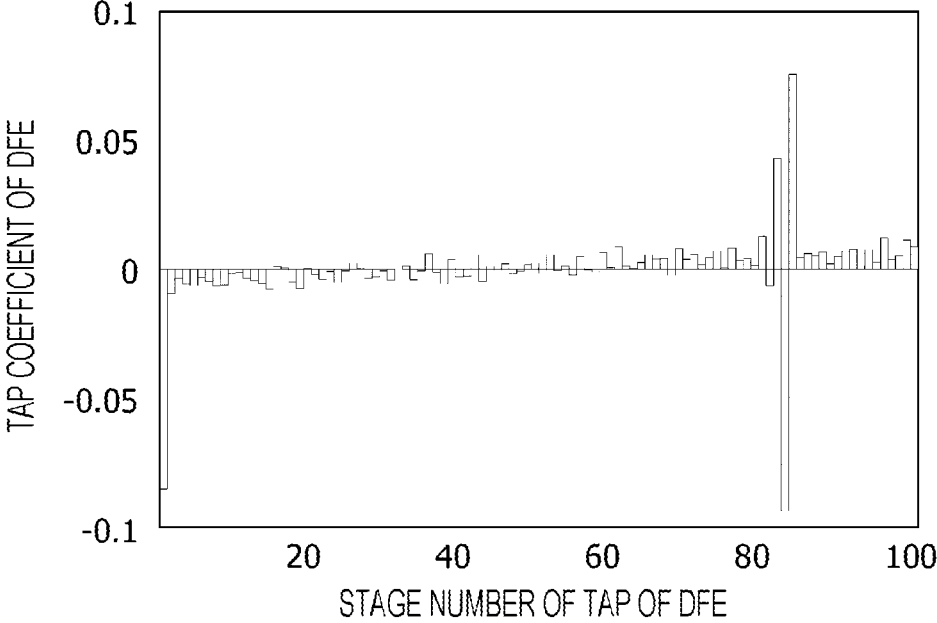
Figure 6:
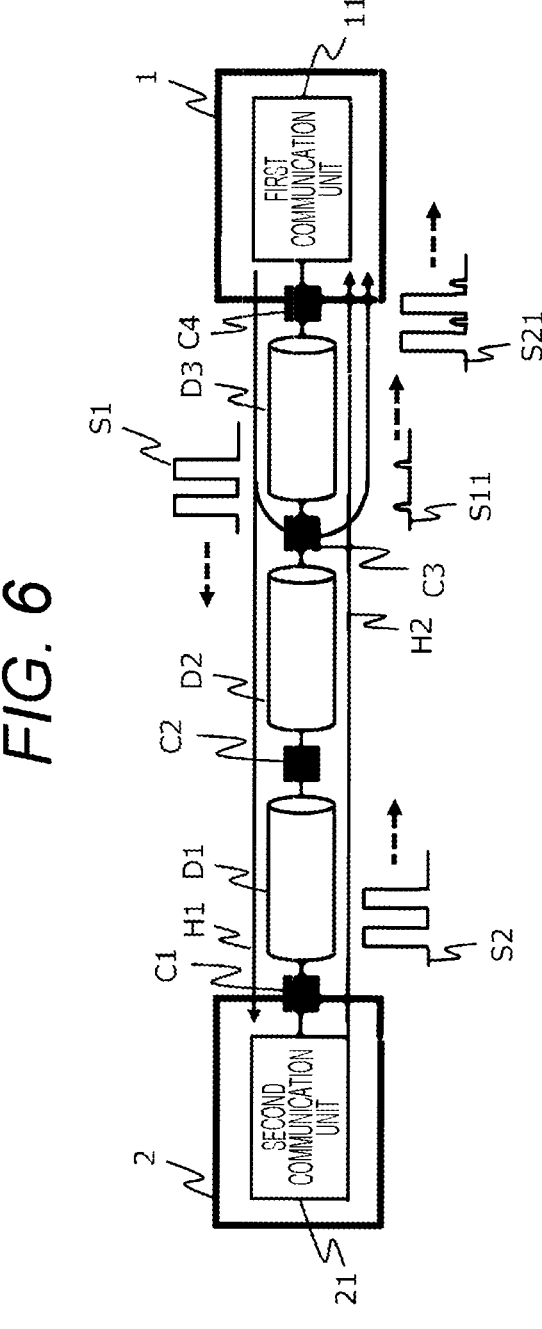
FIG. 6 is a diagram illustrating an example of a transmission path.
Figure 7:
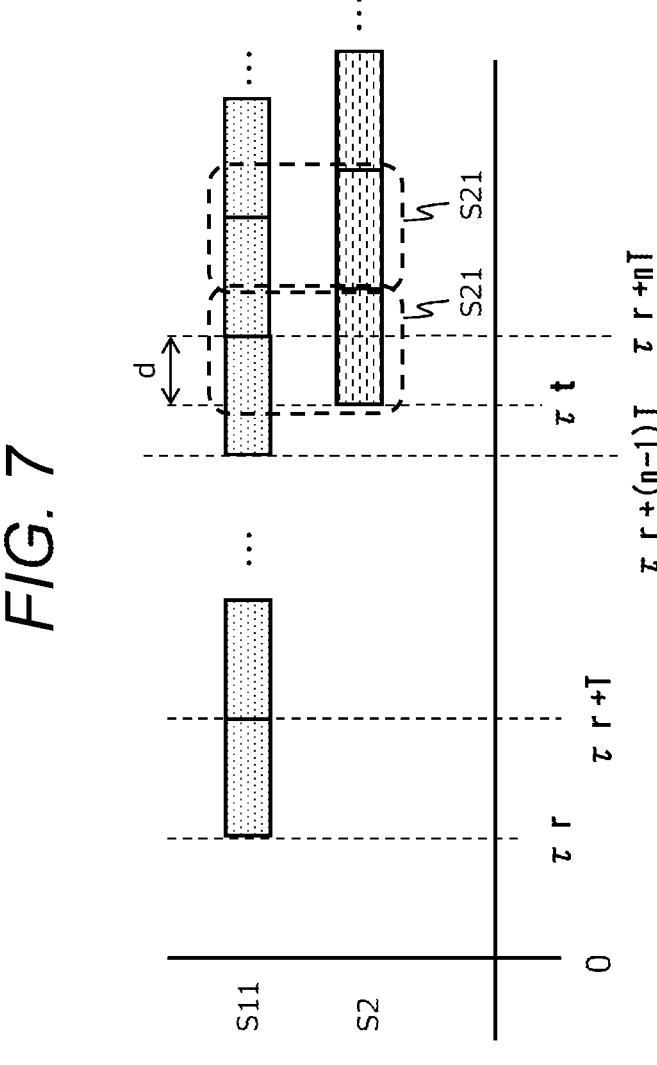
FIG. 7 is a view illustrating a relationship between an abnormality position and a reception signal.

Abnormality position determination processing performed by the communication system S will be described with reference to FIGS. 4 to 7. FIG. 4 is a flowchart illustrating abnormality position determination processing performed by the communication system S; FIG. 5 is a diagram illustrating examples of tap coefficients; FIG. 6 is a diagram illustrating an example of the transmission path 3; and FIG. 7 is a view illustrating a relationship between an abnormality position and a reception signal.

First, in step S301, only the second communication device 2 continuously transmits a prescribed reference waveform toward the first communication device 1. In the next step S302, the DFE unit 14 of the first communication device 1 calculates a tap coefficient by a known method and stores the tap coefficient as a reference value. This reference value represents, for example, a loss of a signal due to the transmission path 3. In the next step S303, both the first communication device 1 and the second communication device 2 continuously transmit the same reference waveform at the same timings. Note that it is desirable that the reference waveform in step S301 and the reference waveform in step S303 be the same.

In the next step S304, the DFE unit 14 of the first communication device 1 calculates a tap coefficient by a known method and stores the tap coefficient as a comparison value. As will be described in detail later, the comparison value includes not only a loss of a signal due to the transmission path 3 but also reflection of the signal at a defect position. In the next step S305, the DFE unit 14 calculates a physical distance to an abnormality position using a difference between the reference value stored in step S302 and the comparison value stored in step S304. The calculation in this step will be described in detail later.

FIG. 5 is a view illustrating examples of the tap coefficients in steps S302 and S304. FIG. 5(*a*) is a view illustrating examples of the tap coefficient in step S302, and FIG. 5(*b*) is a view illustrating examples of the tap coefficient in step S304. Comparing the tap coefficients illustrated in FIG. 5(*a*) with the tap coefficients illustrated in FIG. 5(*b*), the tap coefficient of the 83rd stage is remarkably large in FIG. 5(*b*). The DFE unit 14 determines that a stage number of a tap at which an absolute value of the difference between the tap coefficients is the largest and which is equal to or larger than a prescribed threshold, for example, "0.05", is caused by a reflection wave. A relationship between a stage number and a distance will be described later.

FIG. 6 is a diagram illustrating an example of a configuration of the transmission path 3 and a situation in step S303 of FIG. 4. In the example illustrated in FIG. 6, the transmission path 3 includes a first cable D1, a second cable D2, a third cable D3, a first connector C1, a second connector C2, a third connector C3, and a fourth connector C4. Specifically, the first connector C1, the first cable D1, the second connector C2, the second cable D2, the third connector C3, the third cable D3, and the fourth connector C4 are arranged in this order from the second communication device 2 toward the first communication device 1. Here, a case where a signal is reflected because there is an abnormality in the third connector C3 closer to the first communication device 1 than the second communication device 2 and an impedance value of the third connector C3 increases will be described.

The first communication device 1 transmits a first signal S1 to the second communication device 2 using a first channel H1. The second communication device 2 transmits a second signal S2 to the first communication device 1 using a second channel H2. In step S303 of FIG. 4, the first transmission pattern generation unit 16 and the second transmission pattern generation unit 26 generate the same pattern signal, and the first transmitting circuit 12 and the second transmitting circuit 22 repeatedly transmit the pattern signal. The first signal S1 and the second signal S2 are, for example, signals which are high only for a duration of the first one UI and are all low in the other time.

When the first transmitting circuit 12 transmits the first signal S1 in the channel H1, reflection noise S11 reflected at an abnormality position is superimposed on the second signal S2 in the channel H2 and received by the first communication device 1 as a reception signal S21. Since the first signal S1 and the second signal S2 are repeatedly transmitted at the same timings with the same cycle T as described above, the reception signal S21 similarly includes the reflection noise S11 several times. Therefore, the DFE unit 14 calculates tap coefficients for the reception signal S21 including the reflection noise S11. The abnormality position determining unit 111 identifies a coefficient corresponding to the reflection noise S11 among the tap coefficients calculated by the DFE unit 14 to calculate a position where the reflection has occurred, that is, the abnormality position.

FIG. 7 is a view illustrating a relationship between an abnormality position and a reception signal in the situation illustrated in FIG. 6. The horizontal axis in FIG. 7 represents that more time has elapsed as proceeding toward the right side, and the upper part represents reception of the reflection noise S11 by the first communication device 1, and the lower part represents reception of the second signal S2 by the first communication device 1. Since the third connector C3 in which the abnormality occurs is closer to the first communication device 1 than the second communication device 2 as described in FIG. 6, the first communication device 1 receives the reflection noise S11 earlier than the second signal S2.

In FIG. 7, a repetition cycle of the first signal S1 and the second signal S2 is T. The first communication device 1 receives the reflection noise S11 for the first time at a time τr, and thereafter, receives the next reflection noise S11 every time a duration T elapses. That is, the time at which the first communication device 1 receives the reflection noise S11 is the time τr, a time τr+T, a time τr+2T, a time τr+3T, and so on. Note that the time τr is determined by a generation position and a propagation speed of the reflection noise S11, and thus, the generation position of the reflection noise S11 can be easily calculated if the time τr can be directly measured. However, the reflection noise S11 is weak, and thus, is hardly detected alone.

The first communication device 1 starts receiving the first second signal S2 at a time τt. Note that the time τt may be actually measured or may be calculated using a length of the transmission path 3 and the signal propagation speed in the transmission path 3. Then, the (n+1)th reflection noise S11 is received at a time τr+nT which is a time later than the time τt. However, it is difficult for the first communication device 1 to detect the reflection noise S11 alone as described above, and the reflection noise S11 is received as the reception signal S21 superimposed on the second signal S2.

At this time, the reflection noise S11 in the reception signal S21 has a delay of a duration d from the start of reception of the reception signal S21. The duration d is equal to (τr+n×T−τt). When a tap to be adjusted by the DFE setting value holding unit 15 to correspond to the reflection noise S11 is described as a tap N_DFE and a cycle of one UI of the tap is described as Tui, N_DFE is expressed by the following formula.

$$N\_DFE = (\tau r + n \times T - \tau t)/Tui \qquad \text{(Formula 1)}$$

Note that in Formula 1, "n" is an unknown number, and there are a plurality of candidate abnormality positions, but a value of n is substantially uniquely obtained by the length of the transmission path 3 and a duration of the cycle T, in other words, the number of pieces of data included in one cycle. For example, when the transmission path 3 is 10 to 15 m and the number of pieces of data included in one cycle is 100 bits or more, n=1 in many cases. Therefore, it can be calculated if a value of N_DFE can be identified, and, when the signal propagation speed in the transmission path 3 is denoted by v, a distance L from the first communication device 1 to an abnormality occurrence position can be calculated by the following formula.

$$L = \tau r \times 0.5 \times v = (Tui \times N\_DFE + \tau t - n \times T) \times 0.5 \times v \qquad \text{(Formula 2)}$$

For example, when the influence of the reflection noise S11 appears on the 83rd stage of the tap coefficient as illustrated in FIG. 5, Tui which is the cycle of one UI is 1 nanosecond, τt is 40 nanoseconds (the transmission path 3 is 12 m), the cycle T is 100 nanoseconds, and the propagation speed v is 300,000 km per second, L is 4.45 m.

According to the above-described first embodiment, the following operational effects can be obtained.

(1) The first communication device 1 includes: the first transmitting circuit 12 that repeatedly outputs a first prescribed signal S1 to the transmission path 3 at a prescribed cycle T; the first receiving circuit 13 that receives a second prescribed signal S2 repeatedly output from the second communication device 2 at the prescribed cycle T via the transmission path 3; a waveform equivalence processing unit, that is, the DFE unit 14, which performs waveform equivalence processing on the signal received by the first receiving circuit 13; a holding unit, that is, the DFE setting value holding unit 15, which holds parameters of the waveform equivalence processing; a storage unit, that is, the transmission setting holding unit 18, the signal information holding unit 19, and the transmission path length information holding unit 110, storing information on a propagation speed, a duration of the prescribed cycle, and a signal transmission rate in the transmission path 3; and the abnormality position determining unit 111 that calculates a distance to a position of an abnormality in the transmission path 3 using information on a parameter caused by the abnormality in the transmission path among the parameters and the information stored in the storage unit. Therefore, the distance from the first communication device 1 to the abnormality position of the transmission path 3 can be calculated by using the above-described Formula 2. Furthermore, since N_DFE calculated using a known DFE technology, that is, a tap coefficient corresponding to a reflection wave noise S11 is used, the present embodiment can be easily achieved using an existing communication device.

(2) The first transmitting circuit 12 outputs the first prescribed signal S1 at timing when the second communication device 2 outputs the second prescribed signal S2. In other words, the first signal S1 and the second signal S2 are simultaneously output. Therefore, it is easy to calculate an abnormality position.

(3) The communication system S includes the first communication device 1 and the second communication device 2 connected via the transmission path 3. The second communication device 2 includes the second transmitting circuit 22 that repeatedly outputs the second signal S2 to the first communication device 1 via the transmission path 3 at a prescribed cycle. The first communication device 1 includes: the first transmitting circuit 12 that repeatedly outputs the first signal S1 to the second communication device 2 via the transmission path 3 at the prescribed cycle; the first receiving circuit 13 that receives a signal from the transmission path 3; a waveform equivalence processing unit, that is, the DFE unit 14, which performs waveform equivalence processing on the signal received by the first receiving circuit 13; a holding unit, that is, the DFE setting value holding unit 15, which holds parameters of the waveform equivalence processing; and the abnormality position determining unit 111 that calculates a distance to a position of an abnormality in the transmission path 3 using information on a parameter caused by the abnormality in the transmission path 3 among the parameters and information stored in a storage unit. Therefore, the distance from the first communication device 1 to the abnormality position of the transmission path 3 can be easily calculated using an existing communication device.

(4) The first communication device 1 includes: the first receiving circuit 13 that receives the second signal S2 repeatedly output from the second communication device 2 at a prescribed cycle via the transmission path 3; and a storage unit that stores information on a signal propagation speed in the transmission path 3, a duration of a prescribed cycle T, and a transmission rate. The first communication device 1 executes the following communication method. That is, this communication method includes: repeatedly outputting the first signal S1 to the transmission path 3 at the prescribed cycle T; performing waveform equivalence processing on the signal received by the first receiving circuit 13; and calculating a distance to a position of an abnormality in the transmission path 3 using information on a parameter caused by the abnormality of the transmission path 3 among parameters in the waveform equivalence processing and the information stored in the storage unit.

First Modification

In the first embodiment described above, transmission rates of the channel H1 and the channel H2 are the same, and pattern signals of the first signal S1 and the second signal S2 are the same. However, it suffices that time-series waveforms of the two are the same, and the transmission rates and the pattern signals may be different. For example, there is assumed a case where the channel H1 has a transmission rate twice that of the channel H2, one UI of the channel H1 is one nanosecond, and one UI of the channel H2 is two nanoseconds. In this case, a pattern signal of the first signal S1 is obtained by extending the second signal S2 to be doubled. For example, when the second signal S2 is in a high state only for the first one UI, and the first signal S1 is in the high state only for the first two UIs. According to a first modification, it is also possible to cope with a case where the transmission rates of the first channel H1 and the second channel H2 are different.

Second Modification

In the first embodiment described above, a number N_DFE of a tap coefficient corresponding to an abnormality position is identified by comparing two tap coefficients (S305 in FIG. 4). However, N_DFE may be identified using only one tap coefficient value. For example, in general, a low-order tap coefficient is often used for signal compensation. Therefore, a coefficient that is higher than a prescribed order and has a coefficient absolute value exceeding a prescribed threshold may be identified as N_DFE.

Second Embodiment

A second embodiment of a communication system will be described with reference to FIG. 8. In the following description, a difference will mainly be described by applying the same reference signs to the same constituent elements as those of the first embodiment. A point not specifically described is the same as that of the first embodiment. The present embodiment is different from the first embodiment mainly in terms of including a voltage control unit that controls a voltage.

Figure 8:
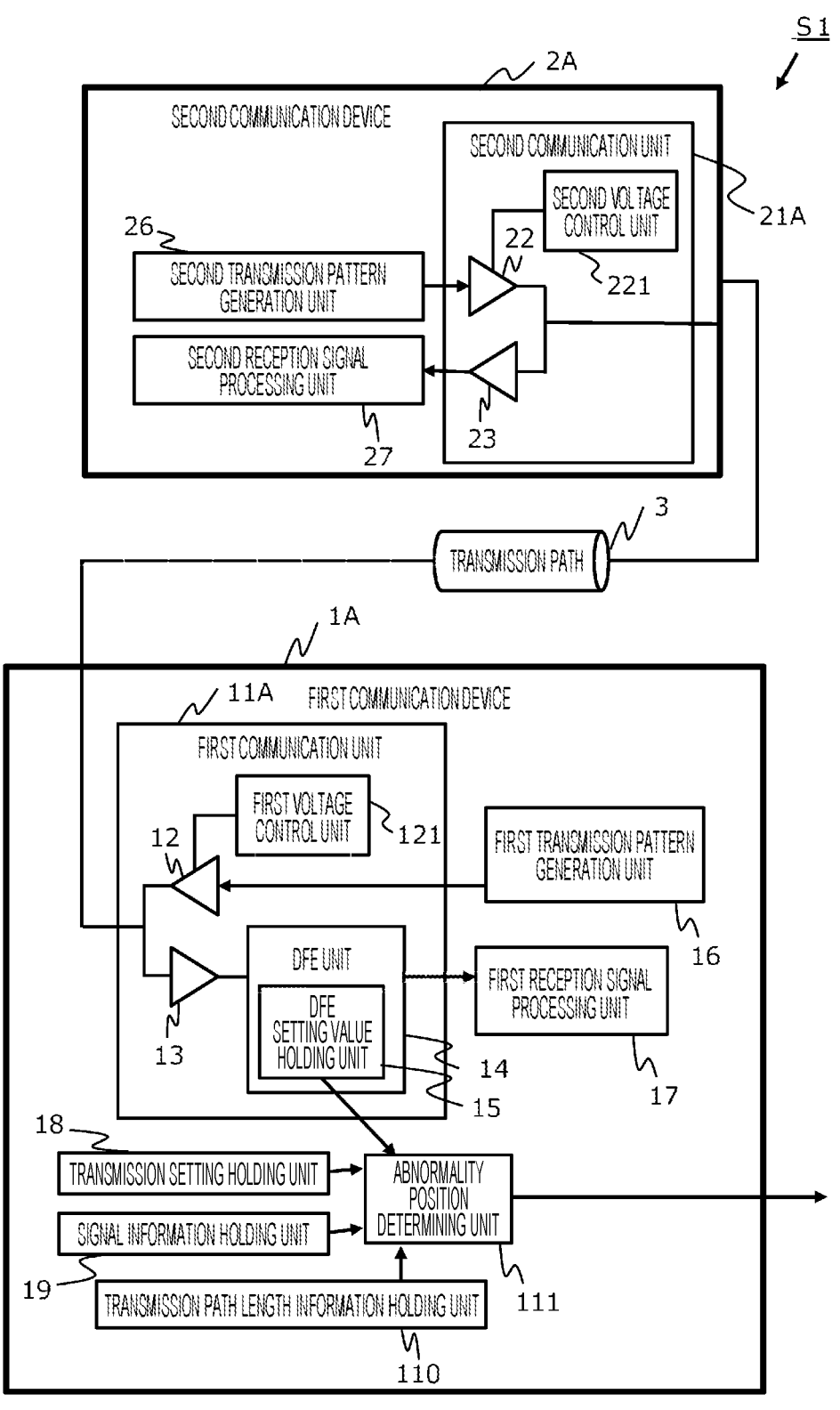
FIG. 8 is a functional configuration diagram of a communication system according to a second embodiment.

FIG. 8 is a functional configuration diagram of a communication system S1 according to the second embodiment. The communication system S1 includes a first communication device 1A and a second communication device 2A. In the first communication device 1A, a first communication unit 11A further includes a first voltage control unit 121 in addition to the configuration of the first communication device 1 in the first embodiment. In the second communication device 2A, a second communication unit 21A further includes a second voltage control unit 221 in addition to the configuration of the second communication device 2 in the first embodiment. The first voltage control unit 121 and the second voltage control unit 221 are, for example, voltage sources.

The first voltage control unit 121 is connected to the first transmitting circuit 12 and controls a voltage of a transmission pattern output from the first transmitting circuit 12. The second voltage control unit 221 is connected to the second transmitting circuit 22 and controls a voltage of a transmission pattern output from the second transmitting circuit 22. The first voltage control unit 121 and the second voltage control unit 221 control the voltages such that the reflection noise S11 in the reception signal S21 becomes relatively large as compared with that in the first embodiment. For example, the first voltage control unit 121 sets a voltage of the first signal S1 to be higher than that in the first embodiment, and the second voltage control unit 221 sets a voltage of the second signal S2 to be lower than that in the first embodiment.

According to the above-described second embodiment, the following operational effects can be obtained.

(5) The first communication device 1 includes the first voltage control unit 121 that increases a voltage of a signal output from the first transmitting circuit 12. Therefore, a voltage level of the reflection noise S11 becomes high and the reflection noise S11 can be easily detected even in a case where an impedance mismatch at an abnormality position is small and a voltage of S11 is small, and thus, a number N_DFE of a tap coefficient corresponding to a constant position can be easily identified.

Modification of Second Embodiment

In the second embodiment described above, both the first communication device 1A and the second communication device 2A include the voltage control units. However, any one of the first communication device 1A and the second communication device 2A may include the voltage control unit. The first voltage control unit 121 provided in the first communication device 1A sets a voltage level of the first signal S1 to be higher than a known voltage level of the second signal S2. The second voltage control unit 221 provided in the second communication device 2A sets a voltage level of the second signal S2 to be lower than a known voltage level of the first signal S1. According to the present modification, the following operational effects can be obtained.

(6) The communication system S1 includes a voltage control unit that makes a signal level of a first prescribed signal to be higher than a signal level of a second prescribed signal, that is, at least one of the first voltage control unit 121 and the second voltage control unit 221. Therefore, it is possible to obtain operational effects similar to those of the second embodiment while reducing the number of voltage control units.

Third Embodiment

A third embodiment of a communication system will be described with reference to FIG. 9. In the following description, a difference will mainly be described by applying the same reference signs to the same constituent elements as those of the first embodiment. A point not specifically described is the same as that of the first embodiment. The present embodiment is different from the first embodiment mainly in terms of delaying a signal.

Figure 9:
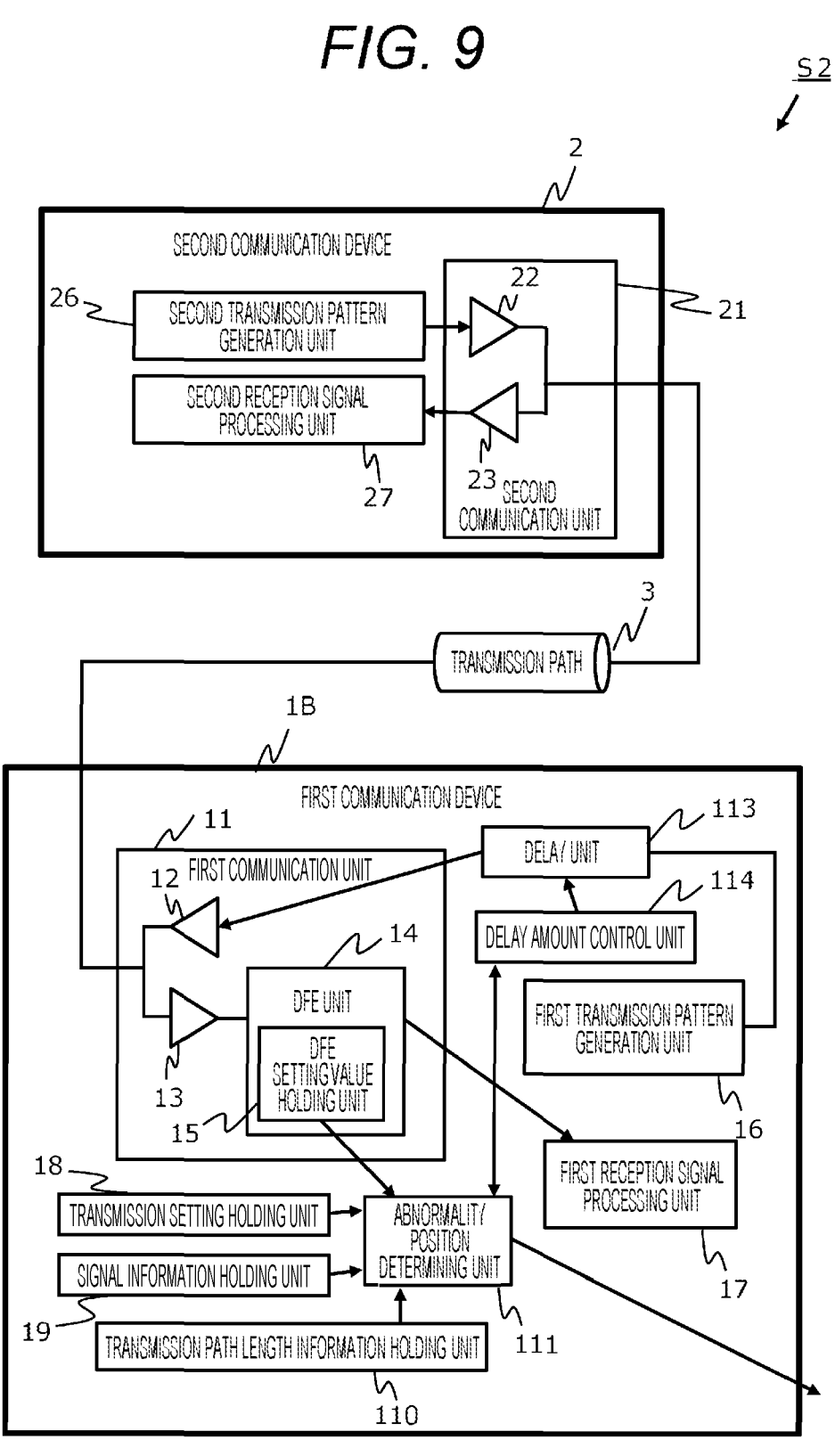
FIG. 9 is a functional configuration diagram of a communication system according to a third embodiment.

FIG. 9 is a functional configuration diagram of a communication system S2 according to the third embodiment. The communication system S2 includes a first communication device 1B and the second communication device 2. A configuration of the second communication device 2 is similar to that of the first embodiment. The first communication device 1B includes a delay unit 113 and a delay amount control unit 114 in addition to the configuration of the first communication device 1 in the first embodiment. The delay unit 113 delays a transmission pattern generated by the first transmission pattern generation unit 16 by a delay amount specified by the delay amount control unit 114 and inputs the delayed transmission pattern to the first transmitting circuit 12.

The delay amount control unit 114 sets a plurality of amounts as will be described later based on the configuration of the DFE unit 14, and outputs the set amounts to the delay unit 113 and the abnormality position determining unit 111. First, the necessity of the delay amount control unit 114 will be described. Since the DFE unit 14 in the present embodiment includes N fixed taps, a signal that can be handled by the DFE unit 14 is limited to a time width of Tui×N when a cycle of one UI of a tap is described as Tui. Therefore, if the reflection noise S11 does not reach within the duration of Tui×N from the start of reception of the second signal S2 in a case where no special measure is taken, it is impossible to reflect the received reflection noise S11 in an equalizer coefficient. More specifically, if the duration d in FIG. 7 is longer than Tui×N in a case where the delay unit 113 and the delay amount control unit 114 do not exist, it is impossible for the abnormality position determining unit 111 to reflect the reflection noise S11 in the equalizer coefficient.

Therefore, the delay amount control unit 114 increases a delay amount in units of Tui×N to change the delay amount up to the cycle T of the first signal S1. For example, it is assumed that the number of taps is "10", Tui is "1 nanosecond", and the cycle T of the first signal S1 is "100 nanoseconds". In this case, a time width that can be handled by the DFE unit 14 is "10 nanoseconds", the delay amount control unit 114 sets a delay time to "0 seconds", "10 nanoseconds", "20 nanoseconds", . . . , "80 nanoseconds", and "90 nanoseconds". A case where the delay time is "0 seconds" can be handled as a case where the duration d in FIG. 7 is "0 seconds to 10 nanoseconds", and a case where the delay time is "90 nanoseconds" can be handled as a case where the duration d in FIG. 7 is "90 seconds to 100 nanoseconds".

According to the above-described third embodiment, the following operational effects can be obtained.

(7) The first communication device 1 includes: the delay amount control unit 114 that sets a delay time that is a time difference between timing at which the second communication device 2 outputs the second signal S2 and timing at which the first transmitting circuit 12 outputs the first signal S1; and the delay unit 113 that delays the timing at which the first signal S1 is output according to the delay time set by the delay amount control unit 114. The abnormality position determining unit 111 calculates a distance to a position of an abnormality in the transmission path 3 using information on a parameter caused by the abnormality of the transmission path 3 among parameters, information stored in a storage unit, and the delay time. Therefore, even when the DFE unit 14 having a small number of taps is used, it is possible to obtain operational effects similar to those of the first embodiment.

First Modification of Third Embodiment

In the third embodiment described above, the delay amount control unit 114 determines the delay amount on the basis of the calculation. However, the delay amount control unit 114 may randomly determine the delay amount.

Second Modification of Third Embodiment

It is assumed that the DFE unit 14 includes only the fixed tap in the first to third embodiments described above. However, the DFE unit 14 may have a floating tap. For example, the DFE unit 14 may include only a plurality of floating taps, or may include a combination of a fixed tap and a floating tap. According to the present modification, it is possible to cope with a long time width with a small number of taps using the floating tap, and the delay unit 113 and the delay amount control unit 114 are unnecessary.

Fourth Embodiment

A fourth embodiment of a communication system will be described with reference to FIG. 10. In the following description, a difference will mainly be described by applying the same reference signs to the same constituent elements as those of the first embodiment. A point not specifically described is the same as that of the first embodiment. The present embodiment is different from the first embodiment mainly in that a second communication device has a configuration similar to that of the first communication device.

Figure 10:
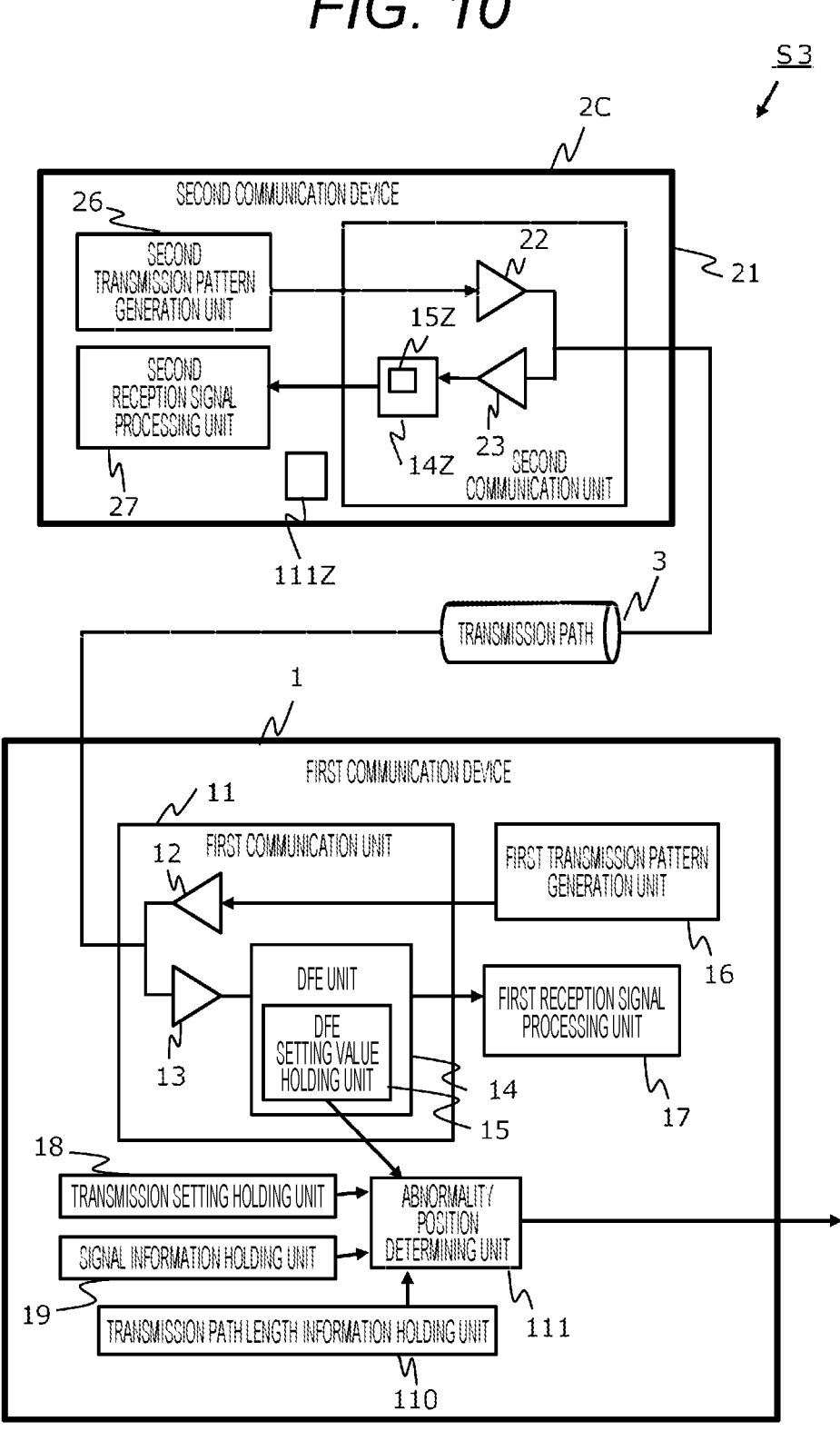
FIG. 10 is a functional configuration diagram of a communication system according to a fourth embodiment.

FIG. 10 is a functional configuration diagram of a communication system S3 according to the fourth embodiment. The communication system S3 includes the first communication device 1 and a second communication device 2C. A configuration of the first communication device 1 is similar to that of the first embodiment. In addition to the configuration of the second communication device 2 in the first embodiment, the second communication device 2C further includes a second DFE unit 14Z, a second abnormality position determining unit 1112, a second transmission setting holding unit 18Z (not illustrated), a second signal information holding unit 19Z (not illustrated), and a second transmission path length information holding unit 110Z (not illustrated). Note that the second DFE unit 14Z includes a second DFE setting value holding unit 15Z corresponding to the DFE setting value holding unit 15.

Configurations and operations of the second DFE unit 14Z, the second abnormality position determining unit 1112, the second transmission setting holding unit 18Z, the second signal information holding unit 19Z, and the second transmission path length information holding unit 1102 are the same as those of the DFE unit 14, the abnormality position determining unit 111, the transmission setting holding unit 18, the signal information holding unit 19, and the transmission path length information holding unit 110 provided in the first communication device 1. The second abnormality position determining unit 1112 outputs information on a determined abnormality position to a configuration (not illustrated) inside the second communication device 2C or to the outside of the second communication device 2C. The abnormality position determining unit 111 and the second abnormality position determining unit 1112 may output the information on the determined abnormality position to the same device.

In the present embodiment, both the first communication device 1 and the second communication device 2 determine the abnormality position in the transmission path 3. Both uses the same calculation method, and a signal of the reflection noise S11 increases as a distance to the abnormality position is closer, and thus, it is difficult to be buried in the noise and the calculation accuracy of the position is enhanced. Therefore, it is possible to identify the position with high accuracy regardless of the abnormality position since both the first communication device 1 and the second communication device 2 determine the abnormality position.

According to the above-described fourth embodiment, the following operational effects can be obtained.

(8) The second communication device 2C includes: the second receiving circuit 23 that receives a signal from the transmission path 3; the second DFE unit 14Z that performs waveform equivalence processing on the signal received by the second receiving circuit 23; the second DFE setting value holding unit 15Z that holds parameters of the second DFE unit 14Z; and the second abnormality position determining unit 1112 that calculates a distance to a position of an abnormality in the transmission path 3 using information on a parameter caused by the abnormality of the transmission path 3 among the parameters of the second DFE unit 14Z and information stored in the second DFE setting value holding unit 15Z. Therefore, it is possible to identify the position with high accuracy regardless of the abnormality position since both the first communication device 1 and the second communication device 2 determine the abnormality position.

Fifth Embodiment

A fifth embodiment of a communication system will be described with reference to FIGS. 11 and 12. In the following description, a difference will mainly be described by applying the same reference signs to the same constituent elements as those of the first embodiment. A point not specifically described is the same as that of the first embodiment. The present embodiment is different from the first embodiment mainly in that a distance between a plurality of abnormality positions is calculated using only one channel.

In the present embodiment, it is assumed that a plurality of abnormality positions exist, and a distance between the abnormality positions is calculated using one channel. A communication system in the present embodiment may have a configuration similar to that of the first embodiment, or a configuration in which each of a first communication device and a second communication device includes only one of a transmitting circuit and a receiving circuit.

FIG. 11 is a functional configuration diagram of a communication system S4 according to the fifth embodiment. The communication system S4 includes a first communication device 1D and a second communication device 2D. The first communication device 1D is obtained by removing the first transmitting circuit 12, the first transmission pattern generation unit 16, and the transmission path length information holding unit 110 from the configuration of the first communication device 1 in the first embodiment. The second communication device 2D is obtained by removing the second receiving circuit 23 and the second reception signal processing unit 27 from the configuration of the second communication device 2 in the first embodiment. Communication in the present embodiment is performed only in a direction from the second communication device 2D to the first communication device 1D, and the channel H2 illustrated in FIG. 5 in the first embodiment is used.

Figure 12:
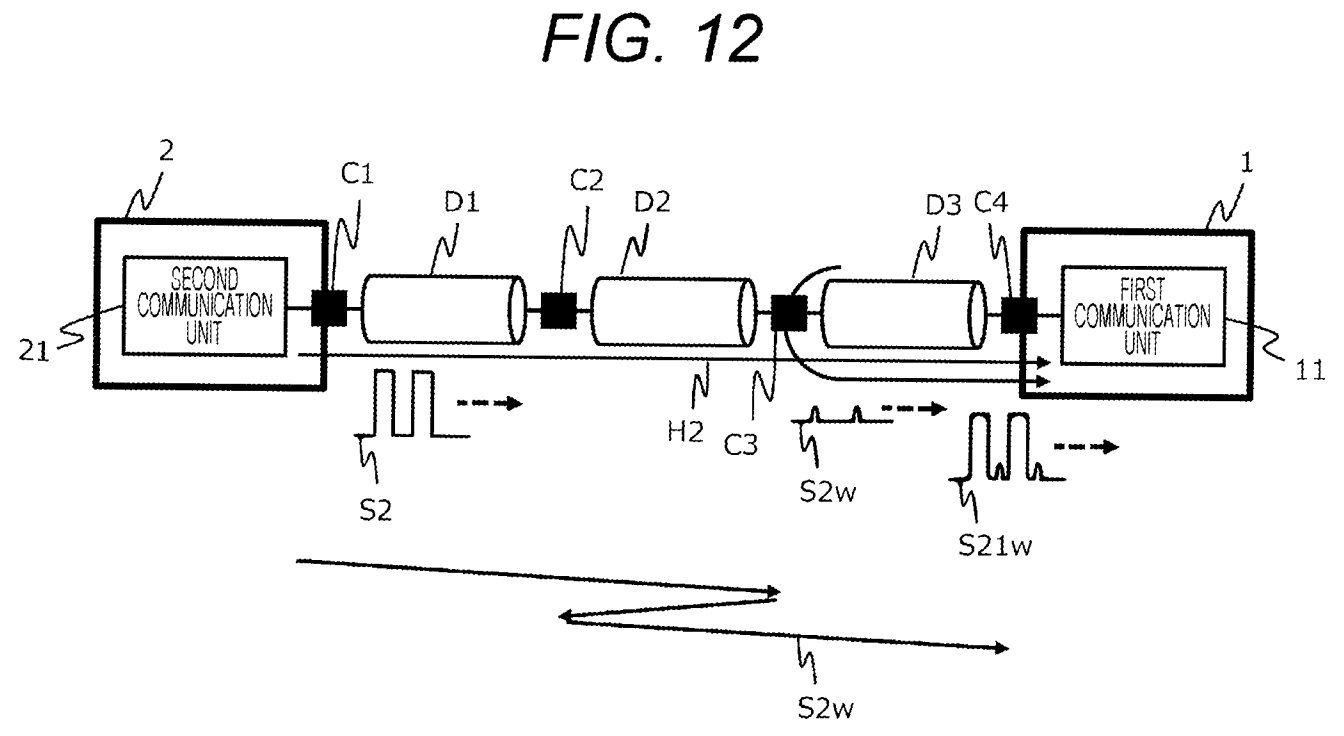

FIG. 12 is a schematic diagram illustrating signal propagation according to the fifth embodiment. A part of the second signal S2 output from the second communication unit 21 reaches the first communication unit 11 while being attenuated. On the other hand, another part of the second signal S2 is reflected by the connector C3 and further reflected by the connector C2 to reach the first communication unit 11 as reflection noise S2W. The first communication unit 11 receives a reception signal S21W on which the attenuated second signal S2 and the reflection noise S2W are superimposed.

The abnormality position determining unit 111 in the present embodiment identifies a stage number Nw of a tap caused by the reflection noise S2W from tap coefficients acquired from the DFE setting value holding unit 15, and calculates a distance WL between two abnormality positions as follows.

$$WL = Tui \times v \times Nw \times 0.5 \qquad \text{(Formula 3)}$$

According to the fifth embodiment described above, the distance WL between two abnormality positions can be calculated using only a signal output from the second communication device 2D without the first communication device 1D outputting a signal.

Sixth Embodiment

A sixth embodiment of a communication system will be described with reference to FIG. 13. In the following description, a difference will mainly be described by applying the same reference signs to the same constituent elements as those of the first embodiment. A point not specifically described is the same as that of the first embodiment. The present embodiment is different from the first embodiment mainly in terms of determining an abnormal site.

FIG. 13 is a functional configuration diagram of a communication system S5 according to the sixth embodiment. The communication system S5 includes a first communication device 1E and the second communication device 2. A configuration of the second communication device 2 is similar to that of the first embodiment. The first communication device 1E further includes an abnormal site determining unit 116 in addition to the configuration of the first communication device 1 in the first embodiment.

The abnormal site determining unit 116 has a configuration of the transmission path 3 and information on a length of the transmission path 3 of each configuration. The abnormal site determining unit 116 determines in which site of the transmission path 3 an abnormality has occurred by using information on a distance to a position of an abnormality output from the abnormality position determining unit 111. The abnormal site determining unit 116 outputs information for identifying a site where the occurrence of the abnormality has been determined to an external server 117 existing outside the first communication device 1E. However, the abnormal site determining unit 116 may output the information for identifying the site where the occurrence of the abnormality has been determined to another configuration, for example, a configuration (not illustrated) included in the first communication device 1E.

For example, it is assumed that the configuration of the transmission path 3 is similar to that in FIG. 5 in the first embodiment, and the length of the transmission path 3 in each of the first cable D1, the second cable D2, and the third cable D3 is 5 m, and the length of the transmission path 3 in each of the first connector C1, the second connector C2, the third connector C3, and the fourth connector C4 is 0.3 m. In this case, if the distance to the abnormality position output by the abnormality position determining unit 111 is 7 m, the abnormal site determining unit 116 determines that the second cable D2 is an abnormal site.

According to the above-described sixth embodiment, the following operational effects can be obtained.

(9) The transmission path 3 includes a plurality of components connected in series. The first communication device 1E includes the abnormal site determining unit 116 that identifies a component in which an abnormality has occurred based on a distance calculated by the abnormality position determining unit 111. Therefore, the maintenance service of the transmission path 3 can be easily implemented at low cost.

In the above-described embodiments and modifications, the configurations of functional blocks are merely examples. Some functional configurations illustrated as separate functional blocks may be integrally configured, or a configuration illustrated in one functional block diagram may be divided into two or more functions. In addition, some of the functions of each functional block may be included in another functional block.

Although the program is stored in the ROM (not illustrated) in each of the above-described embodiments and modifications, the program may be stored in a rewritable nonvolatile storage device, for example, a flash memory. In addition, the first communication device 1 may include an input/output interface (not illustrated), and the program may be read from another device through a medium available by the input/output interface if necessary. Here, the medium indicates, for example, a storage medium attachable to and detachable from the input/output interface or a communication medium, that is, a wired, wireless, or optical network, or a carrier wave or a digital signal propagating through the network. In addition, some or all of the functions implemented by the program may be implemented by a hardware circuit or an FPGA.

Each of the embodiments and modifications described above may be combined. Although various embodiments and modifications have been described above, the present invention is not limited to these contents. Other aspects that can be considered within the scope of the technical ideas of the present invention are also included in the scope of the present invention.

REFERENCE SIGNS LIST 1, 1A, 1B, 1C, 1D, 1E first communication device
2, 2A, 2B, 2C, 2D, 2E second communication device
3 transmission path
11, 11A first communication unit
12 first transmitting circuit
13 first receiving circuit
14 DFE unit
14Z second DFE unit
15 DFE setting value holding unit
15Z second DFE setting value holding unit
18 transmission setting holding unit
18Z second transmission setting holding unit
19 signal information holding unit
19Z second signal information holding unit
21 second communication unit
22 second transmitting circuit
23 second receiving circuit
26 second transmission pattern generation unit
27 second reception signal processing unit
110 transmission path length information holding unit
110Z second transmission path length information holding unit
111 abnormality position determining unit
1112 second abnormality position determining unit 113 delay unit
114 delay amount control unit
116 abnormal site determining unit
121 first voltage control unit
221 second voltage control unit

The invention claimed is:

1. A communication device comprising:
a transmitting circuit that repeatedly outputs a first prescribed signal to a transmission path at a prescribed cycle;
a receiving circuit that receives a second prescribed signal repeatedly output at the prescribed cycle from another communication device via the transmission path;
a waveform equivalence processing unit that performs waveform equivalence processing on the signal received by the receiving circuit, the waveform equivalence processing unit comprising a decision feedback equalizer having a plurality of taps each corresponding to a delay of one unit interval of the signal;
a holding unit that holds parameters of the waveform equivalence processing, the parameters including tap coefficients for the respective taps;
a storage unit that stores information on a signal propagation speed in the transmission path, duration of the prescribed cycle, and a transmission rate; and
an abnormality position determining unit that calculates a distance to a position of an abnormality in the transmission path using information on the parameter caused by the abnormality of the transmission path among the parameters and the information stored in the storage unit, wherein the abnormality position determining unit is configured to,
(i) obtain first tap coefficients calculated by the waveform equivalence processing unit when only the second prescribed signal is repeatedly output from the another communication device;
(ii) obtain second tap coefficients calculated by the waveform equivalence processing unit when both the first prescribed signal and the second prescribed signal are repeatedly output at the prescribed cycle;
(iii) identify, based on a difference between the first tap coefficients and the second tap coefficients, a tap whose coefficient magnitude exceeds a threshold and corresponds to reflection noise caused by the abnormality in the transmission path; and
(iv) calculate the distance to the position of the abnormality based on a tap number of the identified tap, the signal propagation speed, and the duration of the prescribed cycle.

2. The communication device according to claim 1, wherein the transmitting circuit outputs the first prescribed signal at timing at which the another communication device outputs the second prescribed signal.

3. The communication device according to claim 2, wherein the transmission path includes a plurality of the components connected in series,
the communication device further comprising an abnormal site determining unit that identifies the component in which the abnormality has occurred, based on the distance calculated by the abnormality position determining unit.

4. The communication device according to claim 1, further comprising a voltage control unit that increases a voltage of the signal output from the transmitting circuit.

5. The communication device according to claim 1, further comprising:

a delay amount control unit that sets a delay time which is a time difference between timing at which the another communication device outputs the second prescribed signal and timing at which the transmitting circuit outputs the first prescribed signal; and a delay unit that delays the timing at which the first prescribed signal is output according to the delay time set by the delay amount control unit, wherein the abnormality position determining unit calculates the distance to the position of the abnormality in the transmission path using the information on the parameter caused by the abnormality of the transmission path among the parameters, the information stored in the storage unit, and the delay time.

6. A communication system comprising a first communication device and a second communication device connected via a transmission path, wherein the second communication device includes a second transmitting circuit that repeatedly outputs a second prescribed signal to the first communication device via the transmission path at a prescribed cycle, and the first communication device includes:

a first transmitting circuit that repeatedly outputs a first prescribed signal to the transmission path at the prescribed cycle;

a receiving circuit that receives the signal from the transmission path;

a waveform equivalence processing unit that performs waveform equivalence processing on the signal received by the receiving circuit, the waveform equivalence processing unit comprising a decision feedback equalizer having a plurality of taps each corresponding to a delay of one unit interval of the signal;

a holding unit that holds parameters of the waveform equivalence processing, the parameters including tap coefficients for the respective taps;

a storage unit that stores information on a signal propagation speed in the transmission path, duration of the prescribed cycle, and a transmission rate; and an abnormality position determining unit that calculates a distance to a position of an abnormality in the transmission path using information on the parameter caused by the abnormality of the transmission path among the parameters and the information stored in the storage unit, wherein the abnormality position determining unit is configured to:

(i) obtain first tap coefficients calculated by the waveform equivalence processing unit when only the second prescribed signal is repeatedly output from the second communication device;

(ii) obtain second tap coefficients calculated by the waveform equivalence processing unit when both the first prescribed signal and the second prescribed signal are repeatedly output at the prescribed cycle;

(iii) identify, based on a difference between the first tap coefficients and the second tap coefficients, a tap whose coefficient magnitude exceeds a threshold and corresponds to reflection noise caused by the abnormality in the transmission path; and (iv) calculate the distance to the position of the abnormality based on a tap number of the identified tap, the signal propagation speed, and the duration of the prescribed cycle.

7. The communication system according to claim 6, further comprising a voltage setting unit that sets a signal level of the first prescribed signal to be higher than a signal level of the second prescribed signal.

8. The communication system according to claim 6, wherein the second communication device includes:

a second receiving circuit that receives the signal from the transmission path;

a second waveform equivalence processing unit that performs waveform equivalence processing on the signal received by the second receiving circuit;

a second holding unit that holds parameters of the waveform equivalence processing performed by the second waveform equivalence processing unit;

a second storage unit that stores information on a signal propagation speed in the transmission path, duration of the prescribed cycle, and a transmission rate; and a second abnormality position determining unit that calculates a distance to a position of an abnormality in the transmission path using information on the parameter caused by the abnormality of the transmission path among the parameters of the waveform equivalence processing performed by the second waveform equivalence processing unit and the information stored in the second storage unit.

9. A communication method executed by a communication device, which includes a receiving circuit that receives a second prescribed signal repeatedly output from another communication device at a prescribed cycle via a transmission path, and a storage unit that stores information on a signal propagation speed in the transmission path, duration of a prescribed cycle, and a transmission rate, the communication method comprising:

repeatedly outputting a first prescribed signal to the transmission path at the prescribed cycle;

performing waveform equivalence processing on the signal received by the receiving circuit, the waveform equivalence processing comprising decision feedback equalization using a plurality of taps each corresponding to a delay of one unit interval of the signal and generating tap coefficients for the respective taps; and calculating a distance to a position of an abnormality in the transmission path using information on a parameter caused by the abnormality of the transmission path among parameters in the waveform equalization processing and the information stored in the storage unit, the calculating including:

(i) obtaining first tap coefficients calculated by the waveform equivalence processing when only the second prescribed signal is repeatedly output from the another communication device;

(ii) obtaining second tap coefficients calculated by the waveform equivalence processing when both the first prescribed signal and the second prescribed signal are repeatedly output at the prescribed cycle;

(iii) identifying, based on a difference between the first tap coefficients and the second tap coefficients, a tap whose coefficient magnitude exceeds a threshold and corresponds to reflection noise caused by the abnormality in the transmission path; and (iv) calculating the distance to the position of the abnormality based on a tap number of the identified tap, the signal propagation speed, and the duration of the prescribed cycle.

* * * * *